Sept. 30, 1958 S. C. YUTER 2,853,772

COMPONENT TRANSFER TOOL

Filed Oct. 5, 1954 2 Sheets-Sheet 1

INVENTOR.

S. C. Yuter

INVENTOR.

S.C. Yuter

United States Patent Office 2,853,772

Patented Sept. 30, 1958

2,853,772

COMPONENT TRANSFER TOOL

Seymour C. Yuter, Hempstead, N. Y., assignor to Underwood Corporation, New York, N. Y., a corporation of Delaware Application October 5, 1954, Serial No. 460,304

2 Claims. (Cl. 29—278)

This invention relates to tools for the transfer of components to and from supporting assemblages, and more particularly to the insertion and removal of components which are to be mounted in or removed from a component-supporting clip.

It is often desirable to temporarily or permanently support articles or components in clips so that the components can be readily mounted or removed. This is particularly true in complex electrical and electronic equipment utilizing large numbers of resistors, capacitors, inductors, crystal diode rectifiers and similar components.

Most of these components have terminals which can be utilized both as electrical connections and support. Both of these functions are conveniently met by mounting the components in clips which provide good electrical contact and support for the terminals.

However, if many components are to be mounted in adjacent clips in a compact assemblage, it becomes very difficult to remove a particular component without touching and perhaps damaging adjacent components. Further, considerable effort is required to disengage the terminals from certain types of clips, and the clips may be permanently damaged or bent out of shape so that they no longer can provide proper electrical contact.

Therefore, it is the principal object of the invention to provide a simple and inexpensive tool for conveniently transferring components to and from terminal-supporting clips.

Another object of the invention is to provide a component transfer tool which limits the amount of force required to spread the terminal-engaging portions of the clips.

A further object of the invention is to provide an improved tool for removing two-terminal components such as resistors, capacitors, inductors, and crystal diodes from terminal-supporting clips.

A still further object of the invention is to provide an improved tool for inserting two-terminal electrical components into terminal-supporting clips.

Still another object is to provide an improved component transfer tool which is readily usable in small spaces and among components which are arranged in close relation with each other.

In accordance with the invention, a tool is provided for transferring a component having two terminals to or from a pair of clips, each of the clips being split to form terminal-holding jaws. The tool comprises a terminal-support member adapted to engage the terminals and a spreader adapted to spread the jaws of the clips prior to the transfer of the component. Means are provided for movably securing the terminal-support member and the spreader together.

In an embodiment of the invention particularly adaptable to inserting a component having two terminals into a pair of clips each of which has terminal-holding jaws, means are provided which are adapted to simultaneously spread the jaws of each clip and impel each terminal between the jaws during the mounting of the component.

An advantage of the invention is that when a component is removed from a pair of clips, the component is eased out rather than snapped out so that breakage due to the component being abruptly stopped by a portion of the tool is avoided.

Other objects, advantages and additional features of the invention will become apparent from the accompanying drawing wherein.

Figure 1:
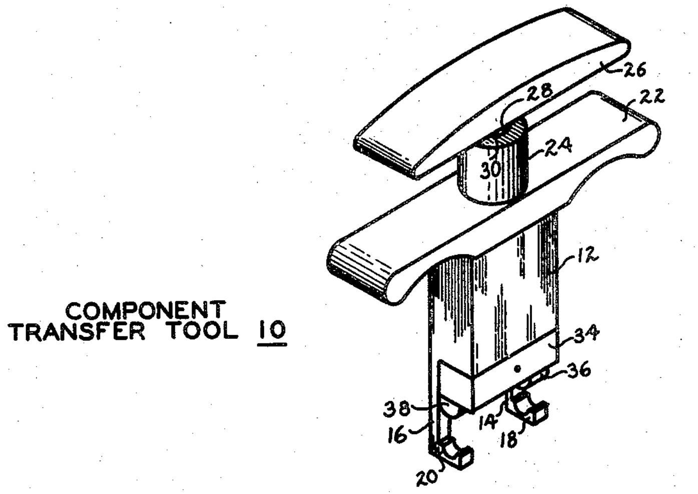
Fig. 1 is a perspective view of a component transfer tool in accordance with the embodiment of the invention which is particularly adaptable to removing components from clips.
Figure 2:
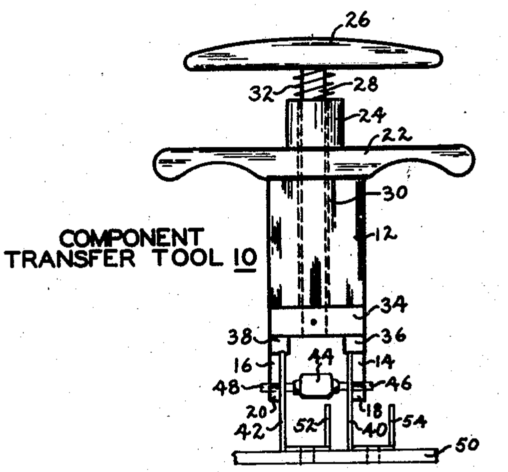
Fig. 2 is a front view of the tool shown in Fig. 1 illustrating the position of the tool prior to the removal of a component from a pair of clips.

The embodiment of the invention which is particularly adaptable to removing components whose terminals are held in clips is shown as the component transfer tool 10 in Figs. 1 and 2. As will hereinafter be shown, the component transfer tool 10 is also adaptable to inserting the terminals of components into terminal-holding clips.

The component transfer tool 10 comprises the body 12 having legs 14 and 16 at one end. Legs 14 and 16 each have a corresponding terminal-support member 18 or 20 which is an extension of the legs 14 and 16. The terminal-support members 18 and 20 are grooved such that the terminal of the components to be transferred readily fit within the groove.

The body 12 has the finger grip 22 attached to its other end and a collar 24 connected to the finger grip 22. The rod 28, to which is connected a handle 26, is inserted through a hole 30 which passes through the collar 24, the finger grip 22 and the body 12. The rod 28 rides in the hole 30 and is normally urged upward by the spring 32 which surrounds the upper portion of the rod 28 and which is compressed against a shoulder on the inside of the collar 24.

Attached to the other end of the rod 28 is the spreader bar 34. Spreaders 36 and 38 are mounted on the spreader bar 34.

The component 44 (see Fig. 2) to be removed has terminals 46 and 48 which are held by the terminal clips 40 and 42 respectively. The spreaders 36 and 38 are positioned to correspond to the terminal clips 40 and 42 and are spaced such that the main body of the component 44 will not contact the spreader bar 34. The terminal clips 40 and 42 are preferably riveted on the insulated support 50. The tie points 52 and 54 of the terminal clips 40 and 42 respectively are employed for electrical connections.

In operation, the legs 14 and 16 are inserted to the rear of the terminal clips 40 and 42 and then brought forward and upward such that the grooves of the terminal-support members 18 and 20 are positioned around the terminals 46 and 48 of the component 44. The handle 26 is then slowly depressed by being pushed toward the finger grip 22 such that the spreaders 36 and 38 contact the upper portions of the terminal clips 40 and 42.

Figure 3:
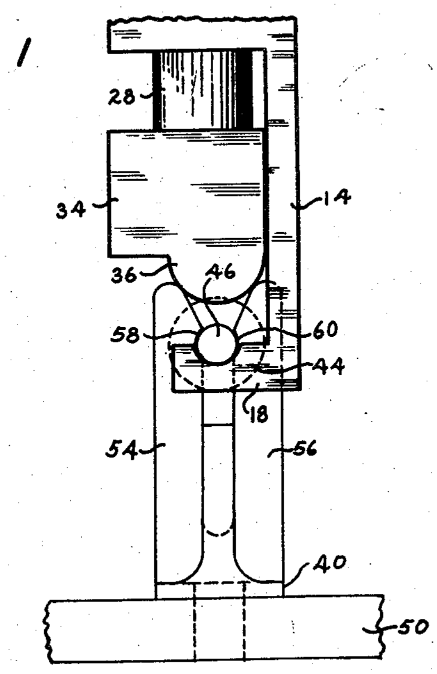
Fig. 3 is a fragmentary enlarged view of the position of the terminal-supporting member and the spreader prior to the removal of the component.

The operation of the component transfer tool 10 is illustrated in greater detail in Fig. 3 in connection with the removal of terminal 46 from the terminal clip 40. The removal of the terminal 48 from the terminal clip 42 operates in a similar manner and at approximately the same time.

The terminal clip 40 comprises the legs 54 and 56 having the terminal-holding jaws 58 and 60 respectively. The terminal jaws 58 and 60 are shaped to contact the maximum amount of surface of the terminal 46. Since proper electrical contact is essential, the terminal clip 40 is preferably made from Phosphor bronze or beryllium copper so that the jaws 58 and 60 tightly engage the terminal 46 positioned therebetween.

The spreader 36 is chosen to have a shape which will provide the maximum jaw separating force consistent with insertion between the legs 54 and 56 of the terminal clip 40. While the spreader is shown in its preferred cylindrical shape, it may be any shape which produces a similar effect.

At the same time as the rod 28 moves the spreader bar 34 and thereby the spreader 36 between the legs 54 and 56 of the terminal clip 40, the terminal-support member 18 pulls on the terminal 46. The resultant operation is two-fold: first, the spreader 36 operates both as a spreader of the legs 54 and 56 and as a base or position in connection with the upper portions of the terminal clip 40 against which the terminal-support member 18 may pull; second, the terminal-support member 18 urges the terminal 46 upward and out of the jaws 58 and 60 which are being separated by the downward motion of the spreader 36.

When the jaws 58 and 60 are separated by an amount corresponding to the diameter of the terminal 46, the terminal 46 is eased from the terminal clip 40 and held in position between the terminal-support member 18 and the spreader 36. At the same time, terminal 48 is being removed from the terminal clip 42 in a similar manner. In general, both terminals are eased from the terminal clips 40 and 42 at the same time. Thereafter the component is securely positioned between the terminal-support members 18 and 20 and the corresponding spreaders 36 and 38 and may be readily removed from the equipment.

The component transfer tool 10 may also be employed to insert the terminals of the component 24 into the terminal clips 40 and 42. This may be accomplished by initially placing the component 44 beneath the spreader bar 34 such that the terminal 46 may be grasped between the spreader 36 and the terminal-support member 18 and the terminal 48 held between the spreader 38 and the terminal-support member 20. Then the component transfer tool 10 is held above the terminal clips 40 and 42 and the legs 14 and 16 are positioned to straddle the terminal clips 40 and 42 such that the terminals 46 and 48 will engage the upper portions of the terminal clips 40 and 42. Thereafter the spreaders 36 and 38 are urged against the terminals 46 and 48 respectively to simultaneously spread the legs of each terminal clip and impel the terminals 46 and 48 between the jaws of the terminal clips 40 and 42.

It should be noted that in some cases the optimum size of the spreader for component insertion is smaller than the optimum size for component removal. In these cases a spreader having an intermediate size may be utilized.

The component transfer tool 10 shown in Figs. 1 and 2 may be constructed in the following manner: the body 12, the finger grip 22, the handle 26, the collar 24 and the spreader bar 34 may be milled or turned from stainless steel and assembled by brazing. More particularly, the collar 24 and the finger grip 22 are brazed to the body 12. The spreaders 36 and 38 are brazed to the spreader bar 34. The handle 26 is brazed to the rod 28. The handle 26 and the rod 28 are then inserted through the body 12 and the rod 28 is pinned in the spreader bar 34.

The component transfer tool 10 may also be bent and formed from sheet metal and by other methods of construction.

Therefore, in accordance with the invention, a simple and inexpensive tool has been provided for conveniently transferring components to and from terminal-supporting clips. Further, the amount of pressure required to spread the terminal-engaging portions of the clips is controlled in that the clips are only spread by an amount sufficient to withdraw the terminals and additional spreading is avoided.

It should be noted that the improved component transfer tool 10 may be readily employed for removing two-terminal components such as resistors, capacitors, inductors and crystal diodes from terminal-supporting clips. However, the principle of the invention may be adapted to constructing a tool for transferring components having only one terminal supported in a clip or more than two termainals supported in corresponding clips.

Figure 4:
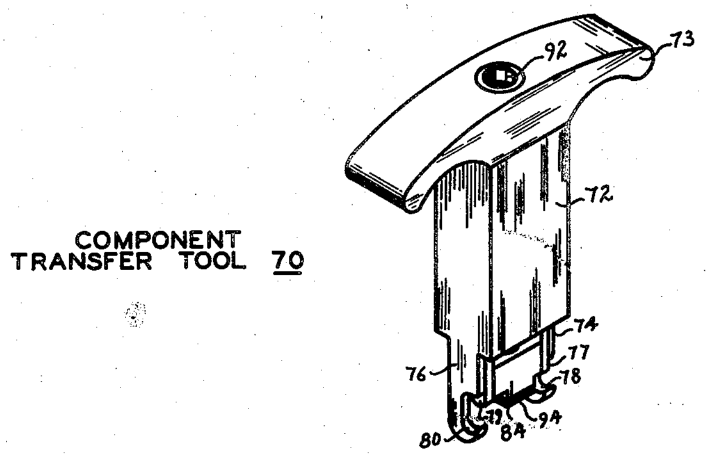
Fig. 4 is a perspective view of an embodiment of the invention which is particularly adaptable to inserting components into clips.
Figure 5:
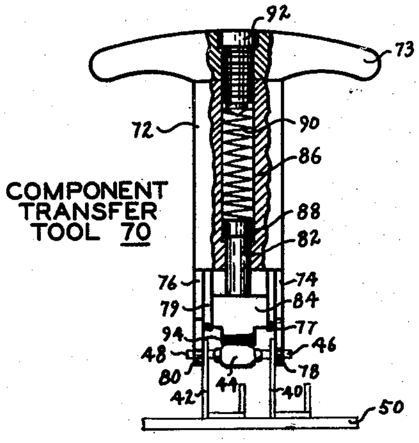
Fig. 5 is a front view, partly broken away, of the tool shown in Fig. 4 illustrating the position of the tool prior to inserting the terminals of a component into a pair of terminal-holding clips.

The embodiment of the invention which is particularly adaptable to inserting components having terminals into clips is shown as the component transfer tool 70 in Figs. 4 and 5. As will hereinafter be explained, the component transfer tool 70 is also adaptable to removing components from terminal-holding clips.

The component transfer tool 70 comprises the body 72 with the handle 73 connected at one end. The legs 74 and 76 are connected to and extend from the other end of the body 72. The spreaders 77 and 79 are attached to the legs 74 and 76 respectively and to the body 72. The legs 74 and 76 have the hook-shaped terminal-support members 78 and 80 respectively. The rod 82, to which is connected the anvil 84, is inserted in the hole 86 (see Fig. 5) from the top of the body 72. The anvil 84 is attached to the rod 82 after it is inserted. The collar 88 abuts against a shoulder formed by a smaller diameter portion of the hole 86, thus limiting the downward motion of the rod 82 and anvil 84. The collar 88 at the end of the rod 82 is urged downward by the coiled spring 90 which is compressed by the socket head screw 92. The socket head screw 92 also functions to connect the handle 73 to the body 72. A rubber protector 94 is cemented to the outer end of the anvil 84.

Figure 6:
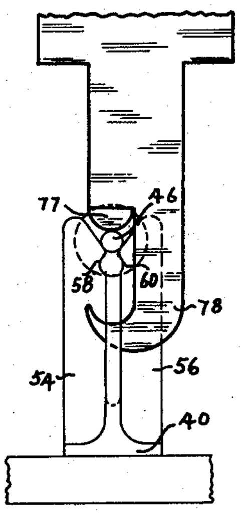
Fig. 6 and Fig. 7 are fragmentary enlarged views illustrating the action of the spreader of the transfer tool of Fig. 4 during the insertion of a terminal of the component between the jaws of a terminal-holding clip.
Figure 7:
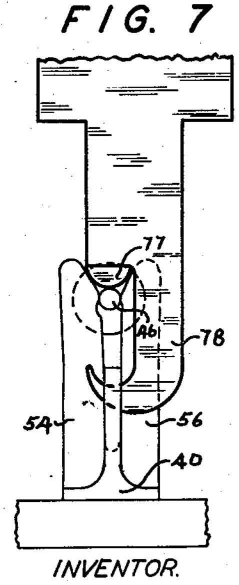

The insertion of the terminals of a component into the pair of terminal-holding clips 40 and 42 which are mounted on the insulated support 50 will be described in connection with Figs. 5, 6 and 7.

The anvil 84 is first urged upwardly against the spring 90 and the body of the component 44 is positioned between the displaced anvil 84 and the terminal support members 78 and 80.

The component 44 having the terminals 46 and 48 is positioned such that the terminal-support members 78 and 80 support the terminals 46 and 48 respectively, and the rubber protector 94 is thereafter urged against the body of the component 44 by the spring 90 after the anvil 84 is released. In this manner the component 44 is placed and held in the component transfer tool 70.

The component transfer tool 70 is then positioned above the terminal clips 40 and 42 (see Fig. 5) with the legs 74 and 76 straddling the terminal clips 40 and 42. The terminals 46 and 48 are then brought into contact with the upper portions of the terminal clips 40 and 42 respectively.

The operation of mounting the component 44 will be described in greater detail in connection with Figs. 6 and 7 which illustrate the insertion of the terminal 46 between the legs 54 and 56 and the corresponding jaws 58 and 60 of the terminal clip 40. The terminal 48 is inserted into the terminal clip 42 in a similar manner and at approximately the same time.

With the terminal 46 resting against the upper portions of the clip 40, the component transfer tool 70 is moved downward (forcing the anvil 84 to move upward against the action of the spring 90) until the spreader 77 (see Fig. 6) contacts the terminal 46. The terminal support member 78 is thus disengaged from the terminal 46. Thereafter the spreader 77 pushes the terminal 46 and begins to spread the legs 54 and 56 of the clip 40. As shown in Fig. 7, the spreader 77 comes in contact with the upper portions of the clip 40 and further spreads the legs 54 and 56 apart and at the same time continues to urge the terminal 46 between the jaws 58 and 60.

When the terminal 46 is pushed slightly more than half way past the upper edges of the jaws 58 and 60, the terminal 46 snaps into position.

The terminal 46 and the terminal 48 are thus inserted in the terminal clips 40 and 42 and the component transfer tool 70 may be removed by a motion backward from the clips 40 and 42 and then upward.

The component transfer tool may also be adapted to removing component 44 by positioning the terminal-support members 78 and 80 beneath the terminals 46 and 48 either pulling both of the terminals simultaneously or one at a time.

The component transfer tool 70 shown in Figs. 4 and 5 may be constructed by milling or turning the body 72, the handle 73, the legs 74 and 76, and the spreaders 77 and 79. The legs 74 and 76 and the spreaders 77 and 79 are brazed to the body 72. The body 72 is drilled to admit the rod 82 which is urged outwardly by means of the spring 90 which is compressed by the socket head screw 92. The rod 82 is then inserted in a hole in the anvil 84 and fixed into position by a suitable cross pin. The rubber protector 94 may be conveniently attached to the anvil 84 by cement.

Therefore, in accordance with this embodiment of the invention, a component transfer tool has been provided which is simple and inexpensive and which controls the amount of pressure required to insert the terminal of a component by spreading a clip only by an amount necessary to receive the terminal. Further, the component transfer tool is readily employed in small spaces and among components which are arranged in close relationship with each other. Further, the invention may also readily be adapted to insert components having one or more than two terminals.

It is to be understood that the construction shown and described in this application is merely illustrative of the invention and that the several features thereof are not limited to the particular construction and arrangement of parts of the illustrated embodiments but that the invention may be embodied in other forms within the scope of the claims.

Having explained the nature and object of the invention and having specifically described a machine embodying the various features of the invention in their preferred forms, what is claimed is:

1. A tool for removing a two-terminal component from a pair of clips, each of said clips being split to form terminal holding jaws, said tool comprising a yoke having two extensions adapted to engage said terminals, said extensions being spaced to straddle the pair of clips, a spreader linearly movable relative to said yoke and having a spreader portion corresponding in position to each of the jaws of said clips, said yoke and said spreader manipulatable to pull the terminals and simultaneously spread the corresponding jaws of said pair of clips during the removal of said component, said spreader simultaneously reducing the terminal-holding force of the terminal-holding jaws and providing a position against which said yoke can exert a force.

2. A tool for removing a component having a terminal from a clip which is split to form terminal-holding jaws comprising a body portion, a terminal support member rigidly attached to said body portion, said terminal support member having a recess adapted to engage the terminal during removal of said component, a spreader movably secured to said body portion, said spreader being cylindrical in shape and positioned opposite said terminal support member, said spreader being adapted to engage and spread the jaws of said clip prior to the removal of said component, said terminal support member and said spreader being movable toward each other to simultaneously reduce the force on the terminal by the terminal-holding jaws and ease the terminal from the clip.

References Cited in the file of this patent

UNITED STATES PATENTS

| | | |
|---|---|---|
| 1,575,517 | Albright et al. | Mar. 2, 1926 |
| 1,637,687 | Echelberger | Aug. 2, 1927 |
| 2,096,639 | Kamrowski | Oct. 19, 1937 |
| 2,344,750 | Stoltz | Mar. 21, 1944 |
| 2,409,191 | Brown | Oct. 15, 1946 |
| 2,454,878 | Marler | Nov. 30, 1948 |
| 2,687,568 | Keiser | Aug. 31, 1954 |

FOREIGN PATENTS

| | | |
|---|---|---|
| 25,908 | France | Mar. 6, 1923 |